(12) United States Patent
Labatte

(10) Patent No.: US 6,530,061 B1
(45) Date of Patent: Mar. 4, 2003

(54) METHOD AND APPARATUS FOR OFFLOADING CHECKSUM

(75) Inventor: Timothy E. W. Labatte, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/471,986

(22) Filed: Dec. 23, 1999

(51) Int. Cl.[7] .............................................. H03M 13/09
(52) U.S. Cl. ...................................................... 714/807
(58) Field of Search ......................................... 714/807

(56) References Cited

U.S. PATENT DOCUMENTS

| | | | | |
|---|---|---|---|---|
| 4,712,215 A | * | 12/1987 | Joshi et al. ................. | 714/776 |
| 5,260,936 A | * | 11/1993 | Bardet et al. ................ | 370/366 |
| 5,430,842 A | * | 7/1995 | Thompson et al. ......... | 709/224 |
| 5,500,864 A | * | 3/1996 | Gonia et al. ................. | 714/799 |
| 5,522,039 A | * | 5/1996 | Snyder et al. ................ | 714/52 |
| 5,754,564 A | * | 5/1998 | Francis ........................ | 714/752 |
| 5,815,516 A | * | 9/1998 | Aaker et al. ................. | 709/236 |
| 5,917,842 A | * | 6/1999 | Sokoler et al. .............. | 714/807 |
| 6,256,765 B1 | * | 7/2001 | Krimmer ..................... | 714/758 |
| 6,279,140 B1 | * | 8/2001 | Slane .......................... | 714/807 |
| 6,289,023 B1 | * | 9/2001 | Dowling et al. ............. | 370/419 |
| 6,345,302 B1 | * | 2/2002 | Bennett et al. .............. | 709/230 |

* cited by examiner

Primary Examiner—Stephen M. Baker
(74) Attorney, Agent, or Firm—Marger Johnson McCollom, P.C.

(57) ABSTRACT

A media access controller for a network interface card accommodates protocol checksum offloads by calculating a hardware assisted checksum for an indiscriminate region of a packet including all or part of the layer 2 header, all of the layer 3 header, all of the layer 4 header, and all data payload areas of the packet. The hardware assisted checksum is then adjusted by software which subtracts non-relevant fields within the packet from the hardware assisted checksum and then verifies the checksum.

28 Claims, 3 Drawing Sheets

METHOD AND APPARATUS FOR OFFLOADING CHECKSUM

BACKGROUND OF THE INVENTION

1. Field of the Invention

The present invention relates generally to Network Interface Cards, and more particularly, to a method and apparatus for off-loading a checksum calculation to a Network Interface Card.

2. Description of the Related Art

A Network Interface Card (NIC) is a hardware device that allows a computer to communicate over a network. A NIC is installed on the computer and controlled by software known as a NIC driver which is loaded into memory by the computer's operating system. A NIC driver is typically supplied by either the manufacturer of the NIC or by a third party, and is written to comply with the requirements of the operating system of the computer on which it will be used.

A NIC driver performs low level networking tasks specific to the NIC hardware in support of other software drivers known as protocols (also referred to as protocol drivers or transport drivers) which perform higher level networking functions. Some examples of commonly used protocols are Transmission Control Protocol/Internet Protocol (TCP/IP), NetBIOS Extended User Interface (NetBEUI, where NetBIOS refers to Network Basic Input/Output Specification), and Internet Packet Exchange/Sequenced Packet Exchange (IPX/SPX).

The Microsoft Windows NT 4.0 operating system includes a driver interface known as Network Driver Interface Specification version 4.0 (NDIS 4.0) through which NIC drivers communicate with protocols, the operating system, and one or more NICs. NDIS forms what is known as a "wrapper" around NIC drivers to abstract the NIC driver from hardware and protocols. This improves the portability of the driver code. NDIS also provides a library of routines which NIC drivers can use to perform many standardized networking tasks, thereby making it easier to create NIC drivers.

In NDIS 4.0, protocol drivers such as TCP/IP drivers must perform layer 4 (TCP) and layer 3 (IP) checksum validation. A newer version of NDIS (sometimes referred to as NDIS 5.0) is included in the Microsoft Windows 2000 operating system. NDIS in Windows 2000 retains the basic requirements, services and architecture of earlier versions, but also provides procedures for off-loading certain tasks to a NIC. One such off-loadable task is the validation of layer 3 and 4 (e.g., TCP/IP) checksums.

SUMMARY OF THE INVENTION

In accordance with the present invention, a hardware assisted checksum is calculated for an indiscriminate region of a packet.

DETAILED DESCRIPTION

An exemplary embodiment of the present invention will first be described briefly, followed by a more detailed description.

Figure 1:
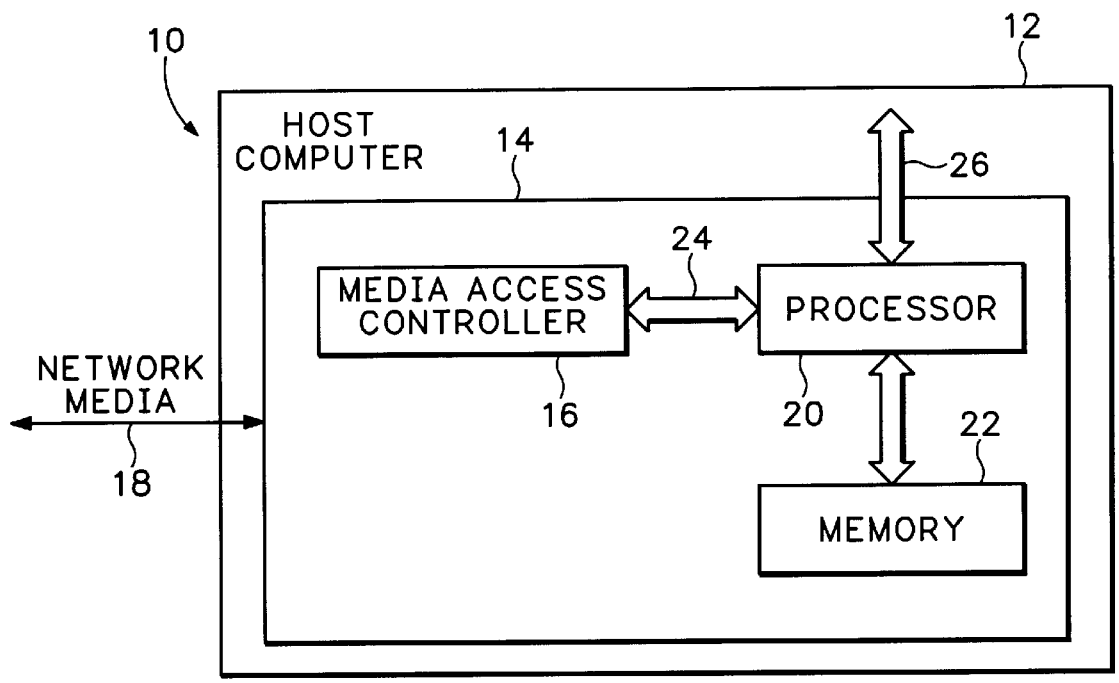
FIG. 1 is a block diagram of an embodiment of a system in accordance with the present invention.

Referring to FIG. 1, an embodiment of a system in accordance with the present invention is shown generally at 10. The system includes a host computer 12 having a network interface card (NIC) 14 which is interfaced to the host computer through a bus 26 such as an Industry Standard Architecture (ISA) bus, an Extended Industry Standard Architecture (EISA) bus, or directly through a PCI bus.

The NIC includes a media access controller (MAC) 16 which is preferably an integrated circuit chip and is connected to the network media (i.e., network hardware) 18. The NIC also includes a processor 20 which interfaces the NIC, including the MAC, to the host computer. The processor 20 is preferably a microprocessor integrated circuit chip controlled by memory 22 which can be external to the processor or integrated into the chip.

In operation, the MAC calculates a hardware assisted checksum for an indiscriminate region of a packet including all or part of the layer 2 header, all of the layer 3 header, all of the layer 4 header, and all data payload areas of the packet. This region is shown as a portion of the packet of FIG. 2. "Indiscriminate" means that the hardware begins calculating the checksum starting at a given location in the packet without regard to whether it is including the layer 2 header, layer 3 header, etc. in the checksum.

After the MAC generates the hardware assisted checksum, the processor 20 passes the hardware assisted checksum to a NIC driver on the host computer which verifies the layer 4 checksum by subtracting non-relevant fields within the packet from the hardware assisted checksum and then comparing the result to the checksum value supplied with the layer 4 header. The non-relevant fields include any portions of the layer 2 header that were included in the hardware assisted checksum, and all layer 3 header fields that are not part of the layer 4 pseudo header. The NIC driver then indicates the success or failure of the checksum verification to the host computer.

The exemplary embodiment of the present invention shown in FIG. 1 will now be described in more detail.

The network media 18 and MAC 16 comply with Ethernet, which is a popular Local Area Network (LAN) specification that is based on American National Standards Institute/The Institute of Electrical and Electronics Engineers, Inc. Standard 802.3 (also referred to as ANSI/IEEE 802.3, or simply "802.3").

The MAC calculates a hardware assisted checksum on the entire packet excluding the first fourteen bytes (bytes 0–13) and the layer 2 cyclical redundancy check (CRC). In a preferred embodiment, the MAC uses microcode to calculate the hardware assisted checksum. When the MAC receives a packet through the network media, it passes the packet and hardware assisted checksum to the processor which then relays this information to the NIC driver on the host computer.

Byte 14 was chosen as the starting point for the hardware assisted checksum. Other starting points could be utilized. However, byte 14 is a convenient starting point because the MAC header (layer 2 header) for standard IEEE 802.3 frames is 14 bytes long. Therefore, if standard frames are used, the hardware assisted checksum does not need to be adjusted for the layer 2 header.

If this embodiment is used with extended ("snap") type frames, which add an additional 5 bytes to the MAC header, a portion of the layer 2 header after byte 14 is included in the hardware assisted checksum, and therefore, will need to be subtracted out of the hardware assisted checksum when it is adjusted.

The processor 20 is preferably an Intel 960 microprocessor. The processor performs the communication tasks associated with interfacing the MAC to the host computer. The NIC communicates with the NIC driver the through transmit and receive buffers. When the processor on the NIC receives a packet and hardware assisted checksum from the MAC, it passes them to the NIC driver by posting the packet to the receive buffer with the hardware assisted checksum appended at the end of the packet. The NIC can be configured to post the layer 2 CRC to the receive buffer, in which case the hardware assisted checksum follows the CRC.

Referring again to FIG. 1, the host computer 12 has NDIS 5.0 installed thereon. As mentioned above, NDIS 5.0 is included in the Microsoft Windows 2000 operating system.

Complete documentation on Windows 2000 is provided in the Driver Developer's Kit (DDK) for Windows 2000 which is published by Microsoft Corporation and is accessible through the internet at the following Universal Resource Locator (URL):

www.microsoft.com./ddk/.

NDIS for Windows 2000 provides procedures for a protocol to query, enable, and utilize the task off-load capabilities of a network interface card (NIC). A NIC is typically supported by a NIC driver known as an NDIS miniport driver (also referred to as a "miniport") which passes packets of data back and forth to the NIC through send and receive buffers.

When a protocol queries a miniport for its NIC's off-load capabilities, the miniport responds by indicating the checksum capabilities of its NIC through the structure NDIS_TASK_TCP_IP_CHECKSUM which is defined in NDIS and passed through an information buffer. This structure allows a miniport to report whether its NIC can validate checksums for TCP, IP, and UDP in either IPv4 and IPv6.

Once a miniport reports the checksum capabilities of its NIC to a protocol, the protocol enables the checksum capabilities by passing a special header through the information buffer. The protocol and miniport then communicate information about task off-load operations using various structures and pointers to access per-packet information as out-of-band data as specified in the DDK for Windows 2000. Although NDIS allows a miniport to report that its NIC can validate checksums for TCP, IP, and UDP in both IPv4 and IPv6, the initial release of Windows 2000, NDIS supports neither UDP, nor IPv6. Therefore, the exemplary embodiment is described in the context of TCP/IP and IPv4. However, the invention is not so limited, and in a preferred embodiment, the miniport performs the requisite steps to determine which protocol queried its checksum capabilities and then responds accordingly.

Figure 3:
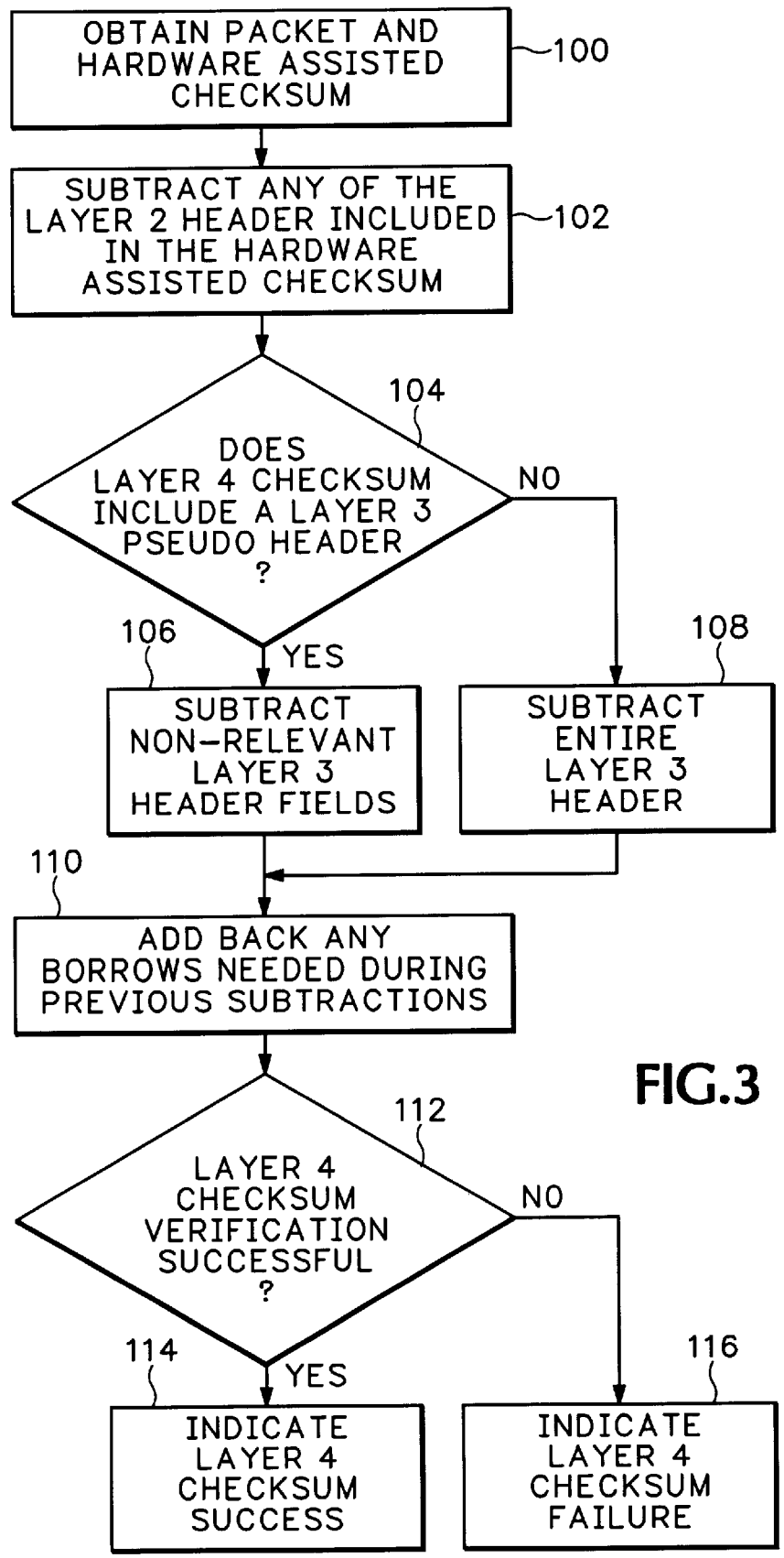
FIG. 3 is a flow diagram illustrating the operation of an embodiment of a NIC driver in accordance with the present invention.
Figure 4:
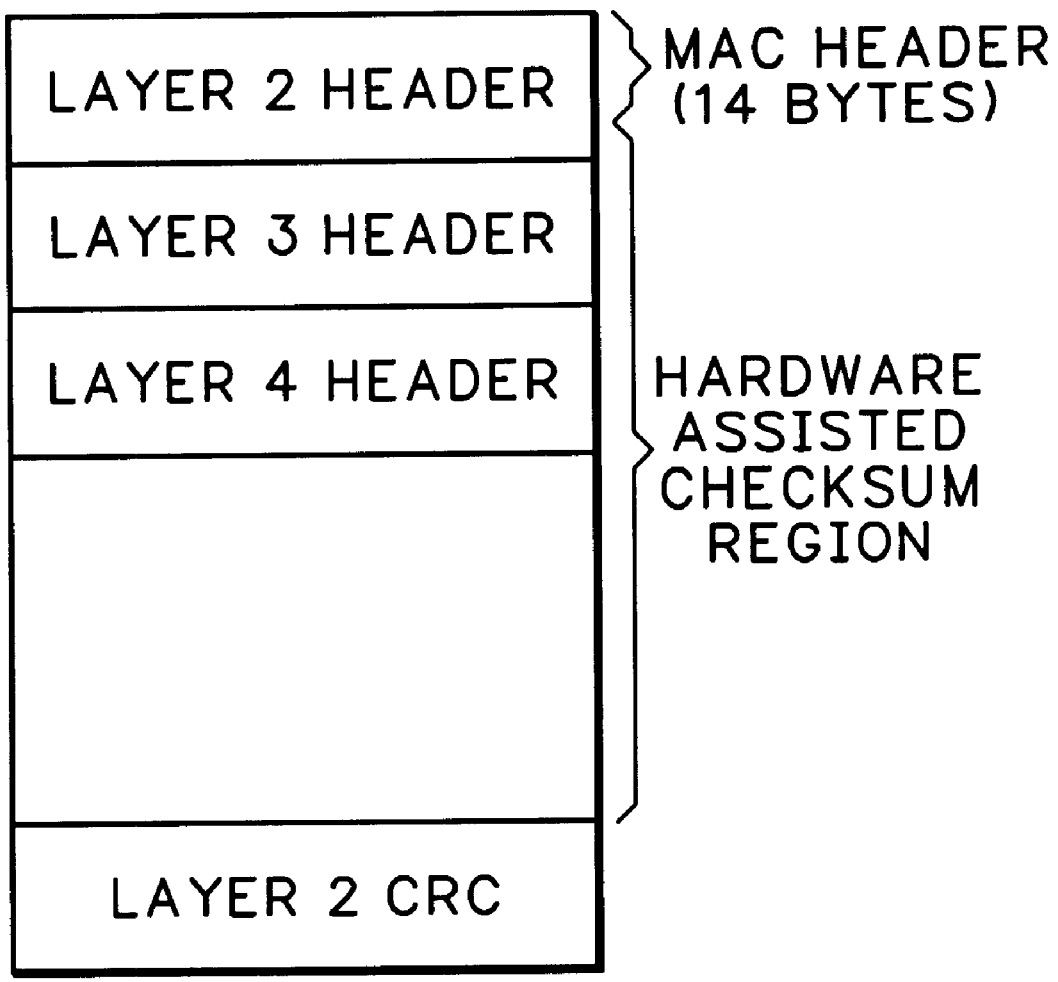
FIG. 4 illustrates the regions of a packet for which another embodiment of the present invention generates a hardware assisted checksum.

In the system of FIG. 1, the NIC driver is a miniport written to support the NIC's checksum offload capabilities. Therefore, it reports its task off-load capabilities as discussed above. When the miniport receives a packet and hardware assisted checksum from the NIC, and the NIC's checksum off-load capabilities are enabled, the miniport adjusts the hardware assisted checksum to verify the layer 4 checksum using the process shown in FIG. 3.

Beginning at 100, the miniport obtains the packet and hardware assisted checksum for the packet from the NIC. At 102, the miniport subtracts any of the layer 2 header that was included in the hardware assisted checksum. As discussed above, none of the layer 2 header would be included in the hardware assisted checksum if standard Ethernet frames are used. At 104, the miniport determines if the layer 4 checksum includes a layer 3 pseudo header. If it does, the miniport subtracts non-relevant layer 3 header fields leaving only the relevant pseudo header fields at 106. Otherwise, at 108, the miniport subtracts the entire layer 3 header.

At 110, the miniport adds back any borrows that were needed during the previous subtraction operations, thereby generating an adjusted hardware assisted checksum. At 112, the adjusted hardware assisted checksum is evaluated to determine if the layer 4 checksum verification is successful. Because the layer 4 checksum, which is located in the layer 4 header, is included in the hardware assisted checksum, the adjusted hardware assisted checksum will equal zero if the checksum verification is successful. The miniport indicates layer 4 checksum success or failure at 114 or 116 in accordance with the results. The miniport then indicates layer 4 checksum success/failure to NDIS using the appropriate NDIS structure.

Figure 2:
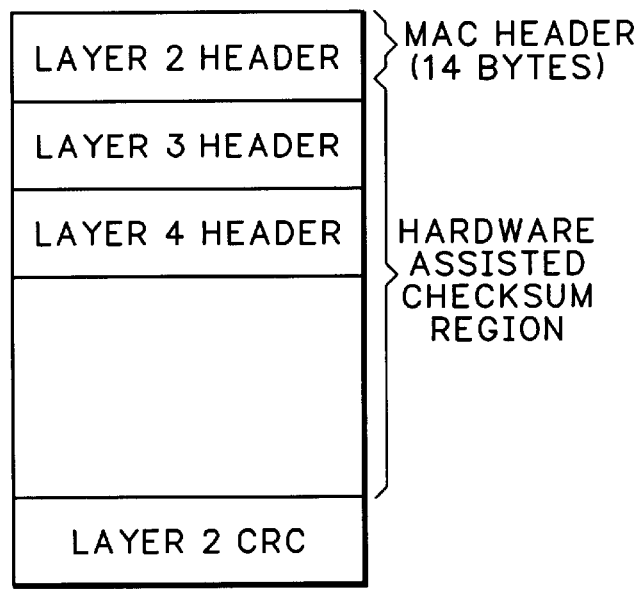
FIG. 2 illustrates the regions of a packet for which an embodiment of the present invention generates a hardware assisted checksum.

Although the MAC shown in FIG. 1 does not include the layer 2 CRC in the hardware assisted checksum as shown in FIG. 2, it can alternatively be adapted to do so, in which case, the miniport must subtract the layer 2 CRC back out during the checksum verification process.

In the embodiment described above, the hardware assisted checksum is adjusted by the miniport. However, the processor 20 and the NIC can also be adapted to perform the adjustment shown in FIG. 3 under the instruction of program code stored in memory 22. In this case, rather than passing the hardware assisted checksum to the miniport, the processor on the NIC would simply indicate success/failure of the layer 4 checksum to the miniport, which would then indicate the checksum success/failure to NDIS.

The MAC of FIG. 1 is shown as part of the NIC. However, a MAC which generates a hardware assisted checksum for an indiscriminate region of a packet as described above can also be utilized in other ways. For example, it can be incorporated directly into the motherboard of the host computer, in which case the hardware assisted checksum can be adjusted by any hardware or software that is capable of determining the non-relevant regions of the packet and subtracting them from the hardware assisted checksum. It should also be noted that the hardware assisted checksum could also be generated by the processor on the NIC and then passed to the miniport in the receive buffer in the same manner as described above.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. A method for validating a protocol checksum for a packet, the method comprising:

generating a hardware assisted checksum for an indiscriminate portion of the packet; and adjusting the hardware assisted checksum for an irrelevant regions of the packet.

2. A method according to claim 1 wherein adjusting the hardware checksum for irrelevant regions of the packet includes subtracting from the hardware checksum non-relevant fields of the packet.

3. A method according to claim 1 wherein adjusting the hardware checksum for irrelevant regions of the packet includes subtracting from the hardware checksum any portion of a layer 2 header that was included in the hardware checksum.

4. A method for validating a protocol checksum for a packet, the method comprising:
   generating a hardware assisted checksum for an indiscriminate region of the packet; and
   adjusting the hardware assisted checksum for irrelevant regions of the packet;
   wherein generating a hardware assisted checksum for an indiscriminate region of the packet includes calculating a checksum for the entire packet except a layer 2 header.

5. A method for validating a protocol checksum for a packet, the method comprising:
   generating a hardware assisted checksum for an indiscriminate region of the packet; and
   adjusting the hardware assisted checksum for irrelevant regions of the packet;
   wherein generating a hardware assisted checksum for an indiscriminate region of the packet includes calculating a checksum for the entire packet except a layer 2 header and a layer 2 CRC packet validation area.

6. A method for validating a protocol checksum for a packet, the method comprising:
   generating a hardware assisted checksum for an indiscriminate region of the packet; and
   adjusting the hardware assisted checksum for irrelevant regions of the packet;
   wherein adjusting the hardware checksum for irrelevant regions of the packet includes subtracting a layer 3 header from the hardware checksum.

7. A method for validating a protocol checksum for a pocket, the method comprising:
   generating a hardware assisted checksum for an indiscriminate region of the packet and
   adjusting the hardware assisted checksum for irrelevant regions of the packet;
   wherein adjusting the hardware checksum for irrelevant regions of the packet includes subtracting a layer 4 pseudo header from the hardware checksum.

8. A method for validating a protocol checksum for a packet, the method comprising:
   generation a hardware assisted checksum for an indiscriminate region of the packet; and
   adjusting the hardware assisted checksum for irrelevant regions of the packet;
   wherein adjusting the hardware checksum for irrelevant regions of the packet includes:
      subtracting irrelevant regions of the packet from the hardware assisted checksum; and
      adding any borrows that were made during subtracting.

9. A method according to claim 1 wherein a NIC driver is used to adjust the hardware checksum for irrelevant regions of the packet.

10. A method for validating a protocol checksum for a packet, the method comprising:
    generating a hardware assisted checksum for an indiscriminate region of the packet; and
    adjusting the hardware assisted checksum for irrelevant regions of the packet;
    wherein a processor on a NIC is used to adjust the hardware checksum for irrelevant regions of the packet.

11. A media access controller that generates a hardware assisted checksum on an indiscriminate portion of a packet.

12. A media access controller according to claim 11 wherein the media access controller generates the hardware assisted checksum by calculating a checksum for the entire packet except a layer 2 header.

13. A media access controller according to claim 11 wherein the media access controller returns the hardware assisted checksum to a driver through a receive buffer.

14. A media access controller that generates a hardware assisted checksum on an indiscriminate region of a packet;
    wherein the media access controller generates the hardware assisted checksum by calculating a checksum for the entire packet except a portion of a layer 2 header.

15. A media access controller that generates a hardware assisted checksum on an indiscriminate region of a packet;
    wherein the media access controller generates the hardware assisted checksum by calculating a checksum for the entire packet except all or a portion of a layer 2 header, and a layer 2 CRC packet validation area.

16. A network interface card that generates a hardware assisted checksum on an indiscriminate region of a packet.

17. A network interface card according to claim 16 wherein the network interface card includes a media access controller that generates a hardware assisted checksum on an indiscriminate region of a packet.

18. A network interface card according to claim 17 wherein the network interface card includes a processor for interfacing the media access controller to a host computer.

19. A system comprising:
    a host computer having a driver interface installed, wherein the driver interface allows a protocol to off-load a protocol checksum validation for a packet; and
    a media access controller interfaced to the host computer, wherein the media access controller generates a hardware assisted checksum for an indiscriminate portion of the packet.

20. A system according to claim 19 further including a NIC driver installed on the host computer, wherein the NIC driver adjusts the hardware assisted checksum for irrelevant regions of the packet.

21. A system according to claim 19 further including a NIC interfaced to the host computer, wherein the media access controller is part of the NIC.

22. A system according to claim 21 wherein the NIC adjusts the hardware assisted checksum for irrelevant regions of the packet.

23. A system comprising:
    a host computer having a driver interface installed, wherein the driver interface allows a protocol to off-load a protocol checksum validation for a packet; and
    a media access controller interfaced to the host computer, wherein the media access controller generates a hardware assisted checksum for an indiscriminate region of the packet;
    wherein:
       the driver interface is NDIS; and
       the media access controller generates a hardware assisted checksum by calculating a checksum for the entire packet except all or a portion of a layer 2 header.

24. A system comprising:
    a host computer having a driver interface installed, wherein the driver interface allows a protocol to off-load a protocol checksum validation for a packet; and
    a media access controller interfaced to the host computer, wherein the media access controller generates a hardware assisted checksum for an indiscriminate region of the packet;

wherein the protocol is TCP/IP.

25. A computer program product comprising a computer usable medium having a computer readable NIC driver stored on the medium, wherein the NIC driver includes:

computer readable program code that causes the computer to obtain a hardware assisted checksum for a portion of a packet from a NIC; and computer readable program code that causes the computer to adjust the hardware assisted checksum for irrelevant regions of the packet.

26. A computer program product comprising a computer usable medium having a computer readable NIC driver stored on the medium, wherein the NIC driver includes:

computer readable program code that causes the computer to obtain a hardware assisted checksum for a packet from a NIC; and computer readable program code that causes the computer to adjust the hardware assisted checksum for irrelevant regions of the packet;

wherein the computer readable program code that causes the computer to adjust the hardware assisted checksum causes the computer to subtract a layer 3 header from the hardware assisted checksum.

27. A computer program product comprising a computer usable medium having a computer readable NIC driver stored on the medium, wherein the NIC driver includes:

computer readable program code that causes the computer to obtain a hardware assisted checksum for a packet from a NIC; and computer readable program code that causes the computer to adjust the hardware assisted checksum for irrelevant regions of the packet;

wherein the computer readable program code that causes the computer to adjust the hardware assisted checksum causes the computer to subtract a layer 4 pseudo header from the hardware assisted checksum.

28. A computer program product comprising a computer usable medium having a computer readable NIC driver stored on the medium, wherein the NIC driver includes:

computer readable program code that causes the computer to obtain a hardware assisted checksum for a packet from a NIC; and computer readable program code that causes the computer to adjust the hardware assisted checksum for irrelevant regions of the packet;

wherein the computer readable program code that causes the computer to adjust the hardware assisted checksum:

causes the computer to subtract irrelevant regions of the packet from the hardware assisted checksum; and causes the computer to add any borrows that were made during the subtraction.

* * * * *

UNITED STATES PATENT AND TRADEMARK OFFICE
CERTIFICATE OF CORRECTION

PATENT NO. : 6,530,061 B1
DATED : March 4, 2003
INVENTOR(S) : Timothy E.W. Labatte It is certified that error appears in the above-identified patent and that said Letters Patent is hereby corrected as shown below:

Column 4,
Line 62, "for an irrelevant" should read -- for irrelevant --.

Column 5,
Line 39, "the packet and" should read -- the packet; and --.
Line 48, "generation a hardware" should read -- generating a hardware --.

Signed and Sealed this

Twenty-second Day of June, 2004

JON W. DUDAS
*Acting Director of the United States Patent and Trademark Office*